United States Patent
Sato et al.

(10) Patent No.: US 9,343,336 B2
(45) Date of Patent: May 17, 2016

(54) PLASMA PROCESSING APPARATUS AND PLASMA PROCESSING METHOD

(71) Applicant: HITACHI HIGH-TECHNOLOGIES CORPORATION, Tokyo (JP)

(72) Inventors: Kohei Sato, Kudamatsu (JP); Kazunori Nakamoto, Kudamatsu (JP); Yutaka Omoto, Hikari (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 14/557,838

(22) Filed: Dec. 2, 2014

(65) Prior Publication Data

US 2015/0083329 A1    Mar. 26, 2015

Related U.S. Application Data

(62) Division of application No. 13/602,421, filed on Sep. 4, 2012, now Pat. No. 8,920,665.

(30) Foreign Application Priority Data

Jun. 28, 2012   (JP) ................................. 2012-144904

(51) Int. Cl.
*H01L 21/67* (2006.01)
*H01L 21/683* (2006.01)
*H01J 37/32* (2006.01)

(52) U.S. Cl.
CPC ..... *H01L 21/67069* (2013.01); *H01J 37/32577* (2013.01); *H01J 37/32697* (2013.01); *H01J 37/32715* (2013.01); *H01J 37/32724* (2013.01); *H01L 21/6833* (2013.01)

(58) Field of Classification Search
None
See application file for complete search history.

(56) References Cited

U.S. PATENT DOCUMENTS

| | | | |
|---|---|---|---|
| 5,160,152 A * | 11/1992 | Toraguchi | H01L 21/67103 279/128 |
| 5,310,453 A | 5/1994 | Fukasawa et al. | |
| 5,656,093 A * | 8/1997 | Burkhart | H01L 21/6831 118/500 |
| 5,738,751 A | 4/1998 | Camerson | |
| 5,751,538 A | 5/1998 | Nakasuji | |
| 5,946,184 A | 8/1999 | Kanno et al. | |
| 6,028,762 A | 2/2000 | Kamitani | |
| 6,215,641 B1 * | 4/2001 | Busse | H01L 21/6833 361/234 |
| 6,243,251 B1 | 6/2001 | Kanno et al. | |
| 6,740,853 B1 | 5/2004 | Johnson et al. | |
| 6,768,627 B1 | 7/2004 | Kitabayashi et al. | |
| 7,199,994 B1 | 4/2007 | Levinson et al. | |

(Continued)

FOREIGN PATENT DOCUMENTS

JP    9-167794    6/1997

*Primary Examiner* — Allan Olsen
(74) *Attorney, Agent, or Firm* — Baker Botts L.L.P.

(57) ABSTRACT

In a plasma processing apparatus including a processing room disposed in a vacuum vessel, a sample stage located in the processing room, a dielectric film disposed on the top surface of the sample stage and serving as the sample mounting surface of the sample stage, and a plurality of electrodes embedded in the dielectric film for chucking the sample to the dielectric film when supplied with electric power, a part of the sample is chucked by supplying electric power to at least one of the electrodes while the sample is mounted on the sample stage; the sample is heated up to a predetermined temperature; a larger part of the sample is chucked by supplying electric power to the other of the electrodes; and the processing of the sample using the plasma is initiated.

5 Claims, 11 Drawing Sheets

(56) References Cited

U.S. PATENT DOCUMENTS

| | | | |
|---|---|---|---|
| 7,525,787 B2 | 4/2009 | Dhindsa et al. | |
| 9,150,967 B2 * | 10/2015 | Watanabe | C23C 4/02 |
| 2001/0019472 A1 | 9/2001 | Kanno et al. | |
| 2003/0161088 A1 | 8/2003 | Migita | |
| 2003/0176079 A1 | 9/2003 | Sogard | |
| 2003/0186545 A1 | 10/2003 | Kamp et al. | |
| 2004/0018127 A1 | 1/2004 | Long et al. | |
| 2004/0218339 A1 | 11/2004 | Nakamura | |
| 2004/0218340 A1 | 11/2004 | Kitabayashi et al. | |
| 2004/0261946 A1 | 12/2004 | Endoh et al. | |
| 2005/0031796 A1 * | 2/2005 | Wu | H01J 37/32082 427/569 |
| 2005/0042881 A1 | 2/2005 | Nishimoto et al. | |
| 2007/0247779 A1 | 10/2007 | Nakamura | |
| 2008/0023139 A1 * | 1/2008 | Yasui | H01L 21/6833 156/345.24 |
| 2008/0170969 A1 | 7/2008 | Yoshioka et al. | |
| 2009/0130821 A1 | 5/2009 | Cox et al. | |
| 2009/0284894 A1 | 11/2009 | Cooke | |
| 2010/0002354 A1 | 1/2010 | Inazumachi et al. | |
| 2011/0000883 A1 | 1/2011 | Endoh et al. | |
| 2011/0181313 A1 | 7/2011 | Sasaki | |
| 2011/0292561 A1 | 12/2011 | Kamimura et al. | |
| 2012/0000774 A1 | 1/2012 | Yoshioka et al. | |
| 2012/0281334 A1 | 11/2012 | Sasaki et al. | |
| 2013/0088808 A1 * | 4/2013 | Parkhe | H02N 13/00 361/234 |
| 2013/0088809 A1 | 4/2013 | Parkhe et al. | |
| 2014/0139049 A1 * | 5/2014 | Fischer | H01J 37/32532 307/149 |
| 2015/0022936 A1 * | 1/2015 | Cox | H05K 3/285 361/234 |

* cited by examiner

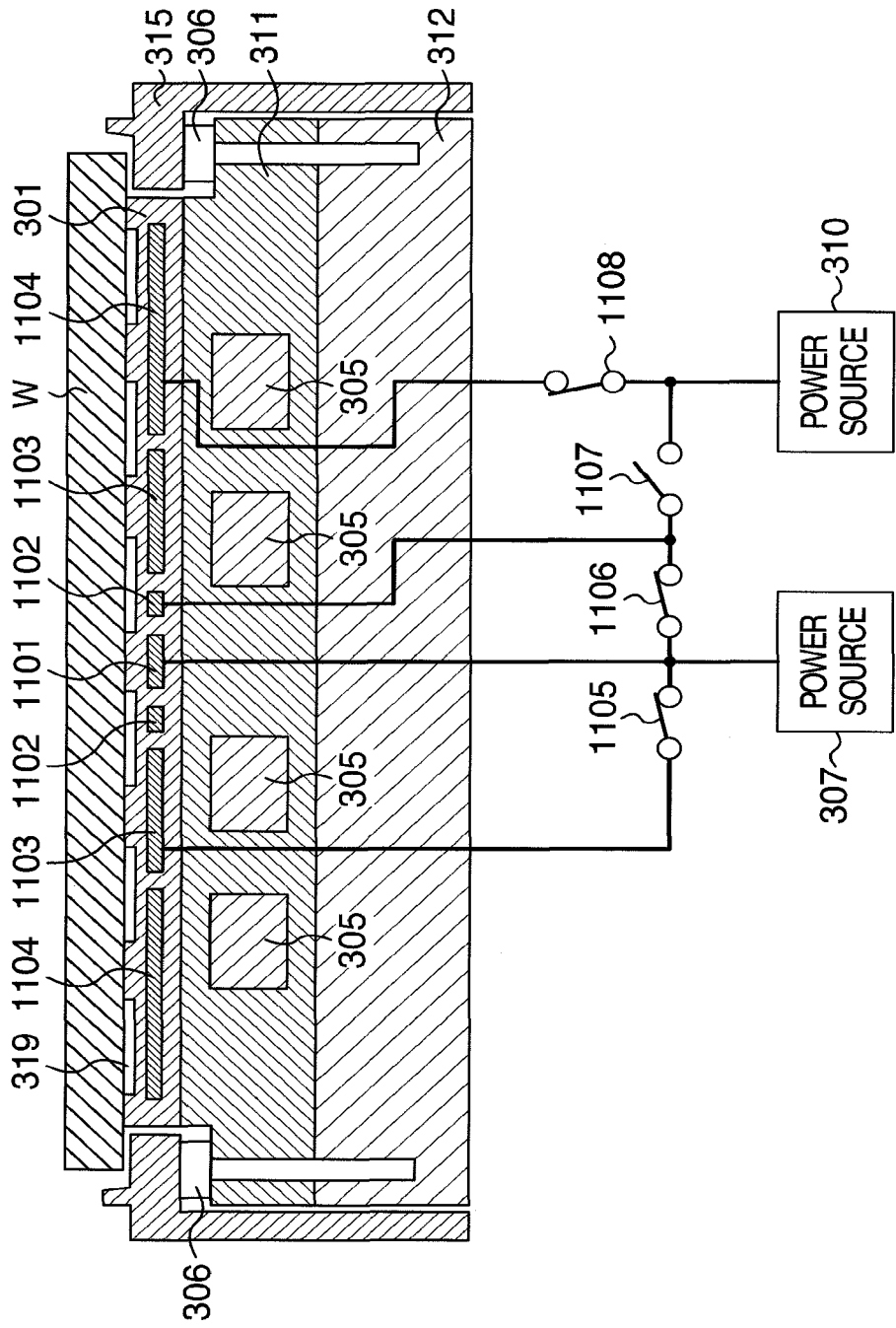

PLASMA PROCESSING APPARATUS AND PLASMA PROCESSING METHOD

INCORPORATION BY REFERENCE

This application is a divisional of application Ser. No. 13/602,421, filed on Sep. 4, 2012, now allowed, which claims the benefit of Japanese Application No. JP 2012-144904, filed Jun. 28, 2012, in the Japanese Patent Office, the disclosures of which are incorporated herein by reference.

BACKGROUND OF THE INVENTION

This invention relates to an apparatus or a method for processing in a processing chamber a substrate sample such as a semiconductor wafer by using plasma formed in the processing chamber housed in a vacuum vessel.

In a plasma processing apparatus in which a sample such as a semiconductor wafer is mounted on a sample stage and the sample is processed with plasma formed over the sample, for example, there are two general processes: one is to remove the intended film existing over the sample surface with a chemical reaction taking place between the sample and the plasma, and the other is to deposit a new film over the surface of the sample. The former is called "etching process" while the latter is called "CVD (chemical vapor deposition)". In such plasma processing procedures, process proceeds through chemical reactions between the sample and ions or active gases that are in the form of chemically active plasma. It is to be noted that the temperature of the sample greatly affects whether or not the chemical reaction mentioned above starts, whether or not the reaction product, in the form of gas generated as a result of the chemical reaction, is released from the sample surface (etching), or whether or not the reaction product deposits as solid on the sample surface (CVD).

When it is desired to etch such a sample whose reaction product has a low vapor pressure, it is necessary to keep low the pressure within the plasma processing chamber or to elevate the temperature of the sample so that the reaction product can be gasified and released from the sample surface. In practice, a certain degree of pressure must be maintained within the plasma processing chamber (not less than 0.1 Pa) and the temperature of the sample must be elevated sufficiently, so as to stabilize the plasma atmosphere in the plasma processing chamber.

In this way, it is necessary to control the temperature of the sample in accordance with desired processes. For this purpose, the temperature of the sample is usually adjusted to a desired value by controlling the temperature of the sample stage mentioned above.

Conventional mechanisms for controlling the temperature of the sample stage include causing heat exchanging fluid, whose temperature is controlled, to flow through within the sample stage, or embedding a heater in the sample stage.

On the other hand, the temperature of the sample is controlled through the heat transfer between the sample and the sample stage. Therefore, in order to effectively perform the heat transfer between the sample and the surface of the sample stage facing the sample, the sample is electro-statically chucked to the upper surface of the sample stage and heat transfer gas such as helium is injected into the gap spaces between the lower surface of the sample and the upper surface of the sample stage. Further, much consideration has been given to the condition for the most effective electrostatic chucking and the area on the sample stage where the sample is to be electro-statically chucked since the control of the sample temperature is greatly affected by the efficiency of heat transfer.

JP-A-09-167794 is known to disclose such a conventional technique as described above. According to the disclosed technique, while a semiconductor wafer is fixed to the sample stage by means of multiple chucking electrodes working in a bipolar configuration, heat transfer gas is fed to control the temperature of the wafer; and while the sample is chucked onto the sample stage under the influence of the multiple chucking electrodes working in a mono-polar configuration, the wafer is processed.

In general, a substrate sample such as a semiconductor wafer is at room temperatures before it is subjected to plasma process, the sample is then mounted on a sample stage which was kept at a desired temperature, the sample is chucked onto the surface of the sample stage, and the temperature of the sample is controlled through heat exchange between the sample and the sample stage.

In case, for example, where a sample, kept at high temperatures of 200° C.~300° C., is processed with plasma, the sample stage is always kept at high temperatures; the sample is mounted on the sample stage kept at high temperatures and then electro-statically chucked onto the sample stage; and the sample is heated with gas as heat transfer medium filled in gap spaces between the sample and the sample stage. When the temperature of the sample is elevated to a value suitable for plasma processing, plasma process will start.

In this case, the sample thermally expands while it is electro-statically chucked onto the sample stage. Accordingly, the lower surface of the sample and the upper surface of the sample stage are subjected to abrasion, so that fine particles (of contaminating material) are produced or the surface roughness of the lower surface of the sample and the upper surface of the sample stage is changed. This in turn changes the efficiency of heat transfer between the sample and the sample stage, leading to the degradation in the control of sample temperature. This adverse effect is not described in the above-mentioned related art technique.

The object of this invention is to provide a plasma processing apparatus or a plasma processing method, which can enjoy a high productivity by employing a technique that can suppress the production of fine particles and the abrasion of the upper surface of the sample stage.

The aforesaid object of this invention can be attained by a plasma processing apparatus including:

a processing room disposed in a vacuum vessel, within which plasma is generated in a depressurized state;

a sample stage located in a lower position in the processing room, over the top surface of which a sample to be processed with the plasma is mounted;

a dielectric film disposed on the top surface of the sample stage and serving as the sample mounting surface of the sample stage; and a plurality of electrodes embedded in the dielectric film for chucking the sample to the dielectric film when supplied with electric power, wherein a part of the sample is chucked by supplying electric power to at least one of the electrodes while the sample is mounted on the sample stage; the sample is heated up to a predetermined temperature; a larger part of the sample is chucked by supplying electric power to the other of the electrodes; and the processing of the sample using the plasma is initiated.

The aforesaid object of this invention can also be attained by a plasma processing method in which a sample to be processed is mounted on the sample mounting surface of a sample stage disposed in a processing room contained in a vacuum vessel, and the processing room is depressurized to generate plasma for processing the sample, wherein a part of the sample is electro-statically chucked to an electrostatic chucking electrode disposed beneath the central area of the sample, the sample is heated up to a predetermined temperature; the entire body of the sample is electro-statically chucked to the sample mounting surface, and the processing of the sample is initiated.

BRIEF DESCRIPTION OF THE DRAWINGS

FIG. 12 is the same as FIG. 11, except for the mode of power applications to electrodes by way of switches.

DETAILED DESCRIPTION OF EMBODIMENTS

Embodiments of this invention will be described below in reference to the attached drawings.

Embodiment

An embodiment of this invention will now be described in FIGS. 1 through 8.

Figure 1A:
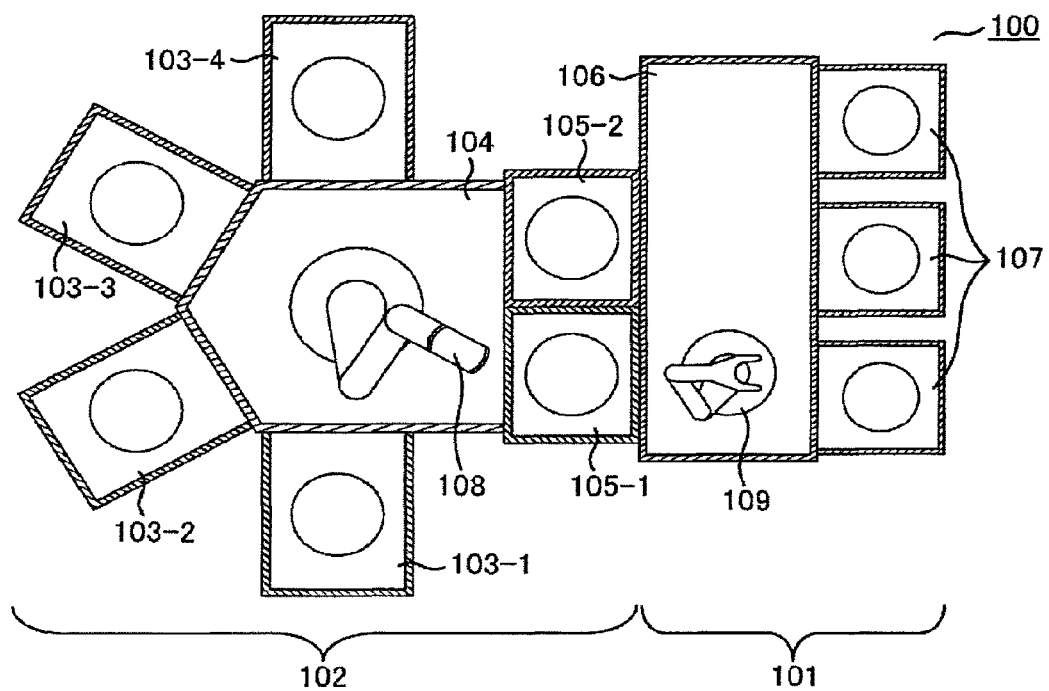
FIG. 1A is a plan view of the general structure of a vacuum processing apparatus having a plasma processing apparatus as an embodiment of this invention.
Figure 1B:
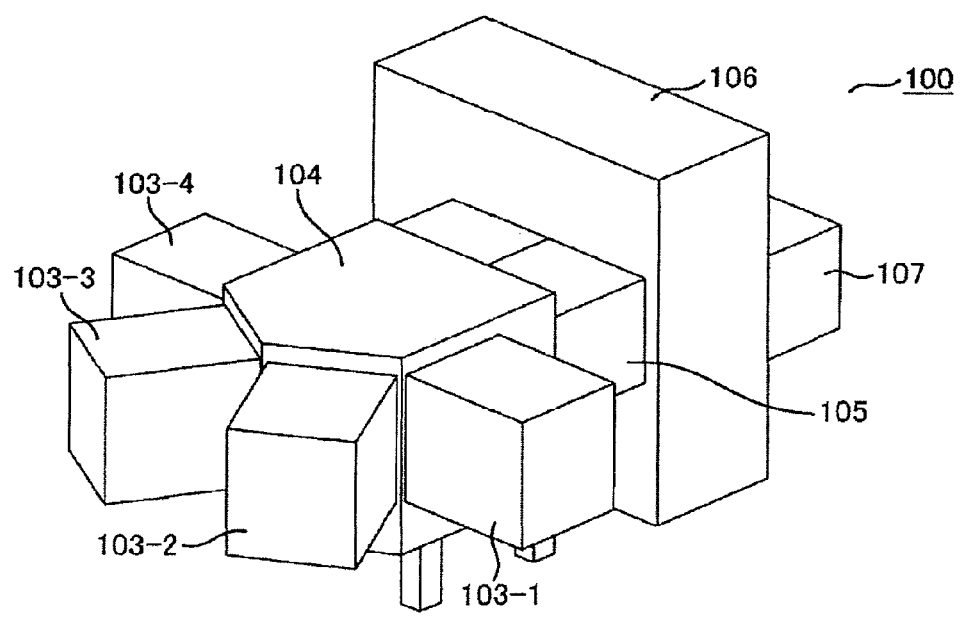
FIG. 1B is a perspective view of the same vacuum processing apparatus shown in FIG. 1A.

FIG. 1A is a plan view of the general structure of a vacuum processing apparatus having a plasma processing apparatus as an embodiment of this invention, and FIG. 1B is a perspective view of the same vacuum processing apparatus.

The vacuum processing apparatus 100 of this embodiment is divided into an atmospheric block 101 and a process block 102, as seen in the front-to-rear direction (e.g. in FIG. 1A, in right-to-left direction and the right side corresponds to the front side). The atmospheric block 101, located in the front area of the vacuum processing apparatus and along the path through which cassettes accommodating therein a plurality of semiconductor wafers as substrate samples to be processed are transferred, serves to take the samples out of the cassettes or put them into the cassettes, or to do the positioning of the taken-out samples under the atmospheric pressure. The processing block 102, forming the rear part of the vacuum processing apparatus and located behind and connected with the atmospheric block 101, serves to transfer or process the wafers under a pressure lower than the atmospheric pressure. The portion of the processing block 102, which connects with the atmospheric block 101, contains a mechanism that controls the internal pressure with a sample mounted in place.

The atmospheric block 101 includes a housing 106 which incorporates in its internal space a transfer robot 109 that transfers a sample held on its arm. On the front side of the housing 106 are located in juxtaposition with one another a plurality of cassette tables 107 on each of which cassettes containing samples to be processed or cleaned are placed.

The processing block 102 comprises processing units 103-1, 103-2, 103-3, 103-4 which depressurize their internal space down to a predetermined pressure for processing samples; a vacuum transfer chamber 104 having a horizontal cross-section of polygon and transferring the samples into the processing units connected to the side walls of the vacuum transfer chamber, under pressures equal to or near the predetermined pressure; and lock chambers 105-1, 105-2 which are vacuum containers connecting the vacuum transfer chamber 104 and the atmospheric block 101 and which can maintain the pressure of their internal space at the atmospheric pressure or depressurize their internal space down to the value equal to or near the predetermined pressure. The processing block 102 is coupled to a turbo-molecular pump or a roughing vacuum pump (not shown) and depressurized to and maintained at a high vacuum.

Parts within the processing units 103-1~103-4 are maintained at temperatures suitable for respective process conditions since in this embodiment the operations of the units are controlled in accordance with command signals from a control unit (not shown) so that the temperature of the samples can be kept at 250° C.~300° C. On the other hand, the vacuum transfer chamber 104, the housing 106 and the cassette tables 107 are kept at room temperatures or within a range of temperatures comparable to them. Then, samples at room temperatures are transferred into the processing units 103-1~103-4, and heated up to desired temperatures within the processing units, to be processed.

Figure 2:
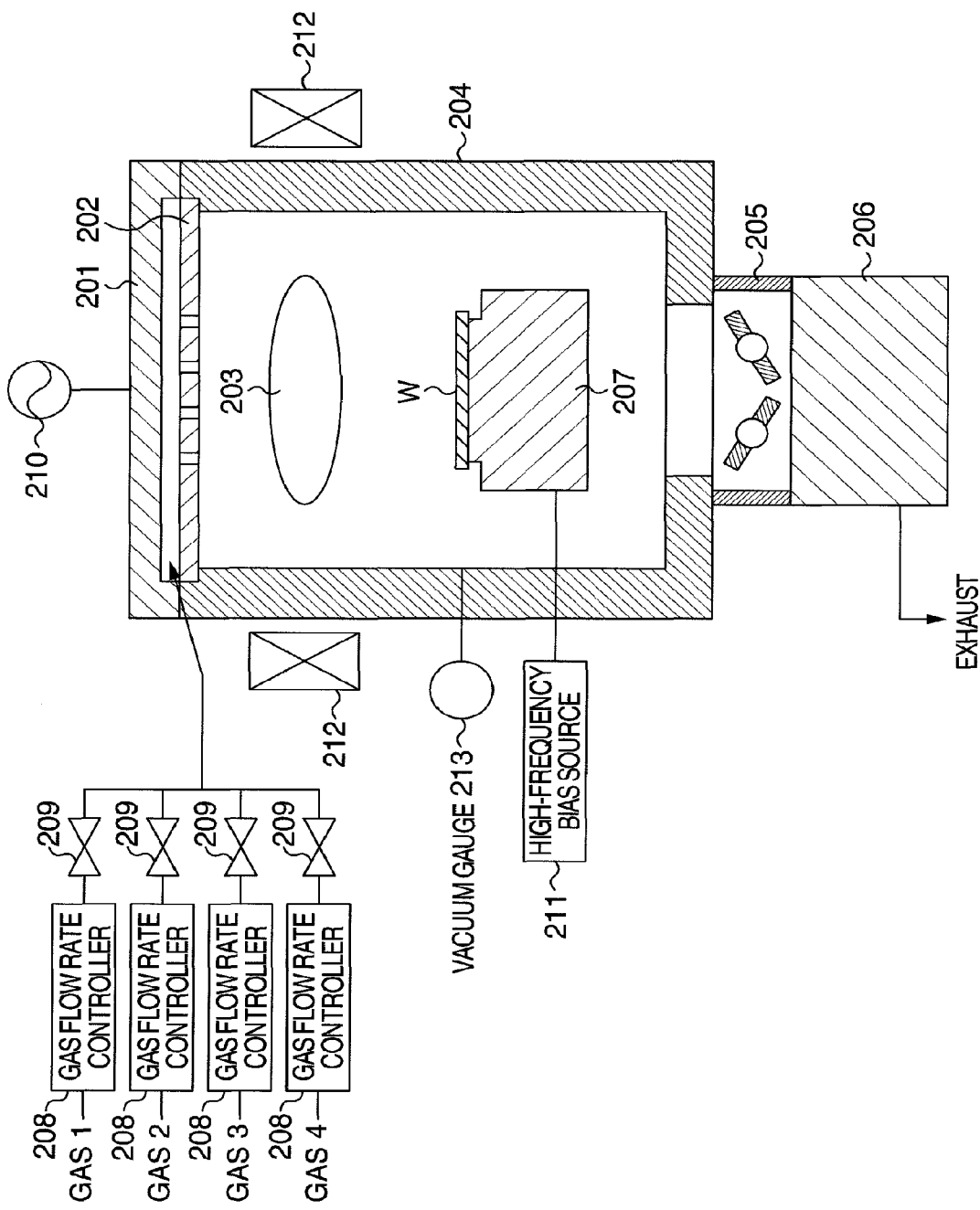
FIG. 2 schematically shows in vertical cross section the structure of the plasma processing apparatus as an embodiment of this invention, shown in FIGS. 1A and 1B.

FIG. 2 schematically shows in vertical cross section the structure of a plasma processing apparatus as an embodiment of this invention, accommodated in the processing unit 103 shown in FIGS. 1A and 1B.

In this embodiment, each processing unit 103 is an etching apparatus in which a sample (or work piece W) is mounted on and held by a sample stage 207 located within a vacuum processing chamber and etched with plasma 203 formed in the internal space of the vacuum processing chamber. The vacuum processing chamber shown in FIG. 2 consists mainly of a cover 201 and a vacuum vessel 204. The processing room which is a space hermetically separated from the outer atmospheric space by the cover 201 and the vacuum vessel 204, is depressurized to and maintained at a state of high vacuum by operating a vacuum pump 206 located below and connected to the vacuum vessel 204.

Process gas, which is fed into the processing room to form plasma 203 in a space above the sample stage 207 in the processing room and to process the sample, is controlled in its flow rate by a gas flow rate controllers 208. In this embodiment, each process gas is a mixture of variety of individual gases 1, 2, 3, 4, ..., and the flow rate of each gas is controlled by a valve 209 and a gas flow rate controller 8 installed in a gas line for the particular gas so that a desired process gas having a desired mixture composition can be obtained.

The multiple gas lines converge at a point downstream of the respective gas flow rate controllers 8 and the gases are mixed in a predetermined proportions at the convergence point to produce a desired process gas, which is fed into the vacuum processing chamber via a single gas line. The single gas line is connected to the upper portion of the vacuum processing chamber so that the process gas is guided into a space of predetermined height defined between the cover 201 and a gas diffusion plate 202 located beneath the cover 201 and forming the ceiling of the processing room.

The process gas, after filling the space between the cover 201 and the gas diffusion plate 202 through diffusion, diffuses into the vacuum processing chamber through perforations provided in the central area of the gas diffusion plate 202. While the process gas is being diffused into the vacuum processing chamber, the vacuum pump 206 is simultaneously driven, and then the balance between the gas supply at the top portion of the processing room and the gas evacuation at the bottom portion of the processing room is adjusted by means of the rotation of a conductance adjusting valve 205 having multiple plate-like flaps rotatable about axles disposed between the exhaust port provided at the bottom of processing room and the entrance of the vacuum pump 206, in response to the command signal generated by a control unit on the basis of the detected result obtained by a vacuum gauge 213. Consequently, the pressure in the processing room is maintained within a range of values suitable for plasma processing.

The process gas conducted into the processing room is turned into plasma due to the excitation of the molecules and the atoms of the process gas owing to the resonance phenomenon occurring as a result of interaction between the electric field generated by an electric field supplying means 210 such as a magnetron and the magnetic field generated by a solenoid coil 212. The molecules of the process gas are ionized into ions and electrons, or dissociated into radicals.

In this embodiment, the processing room is in the shape of a hollow cylinder and the vacuum vessel 204 is also a hollow cylinder. The gas diffusion plate 202 is a circular dielectric plate and concentric with the circular perimeter of the processing room.

The sample stage 207 on which the sample transferred into the processing room is to be mounted, has a cylindrical shape, and the upper surface of the sample stage 207 on which a disk-like sample is mounted, also has a circular or similar shape. The top surface of the sample stage 207 is covered with a dielectric film so that a sample to be processed is attracted and held firmly to the dielectric film by the electrostatic force generated over the dielectric film during processing.

Within the sample stage 207 is provided an electrode of electrically conductive material having a disk or cylinder shape, which is connected with a high-frequency bias source 211. When a sample is processed, the sample is held firmly on the upper surface of the sample stage 207; plasma 203 is generated; and the high-frequency voltage applied to the above-mentioned electrode from the high-frequency bias source 211 creates a bias potential above the upper surface of the sample in response to the potential of the plasma 203. The difference between the plasma potential and the bias potential causes charged particles such as ions constituting the plasma 203 to be attracted toward the sample surface and to bombard the surface. As a result, a selected one of the films of the film composite, which were previously formed by laminating respective films one by one, starts being etched due to chemical and physical reactions taking place between the plasma 203 and the film composite.

The dielectric film (film of dielectric material) covering the top surface of the sample stage 207 may be formed by thermally spraying dielectric material onto the top surface of the sample stage 207 so that a dielectric film of desired thickness may be formed, or by sticking on the top surface of the sample stage 207 a disk member formed through, for example, sintering and having a desired thickness. In this embodiment, as described later, a plurality of film-like electrodes, which serve to generate electrostatic force for chucking the sample to the upper surface of the sample stage, are embedded within such a dielectric film.

Figure 3:
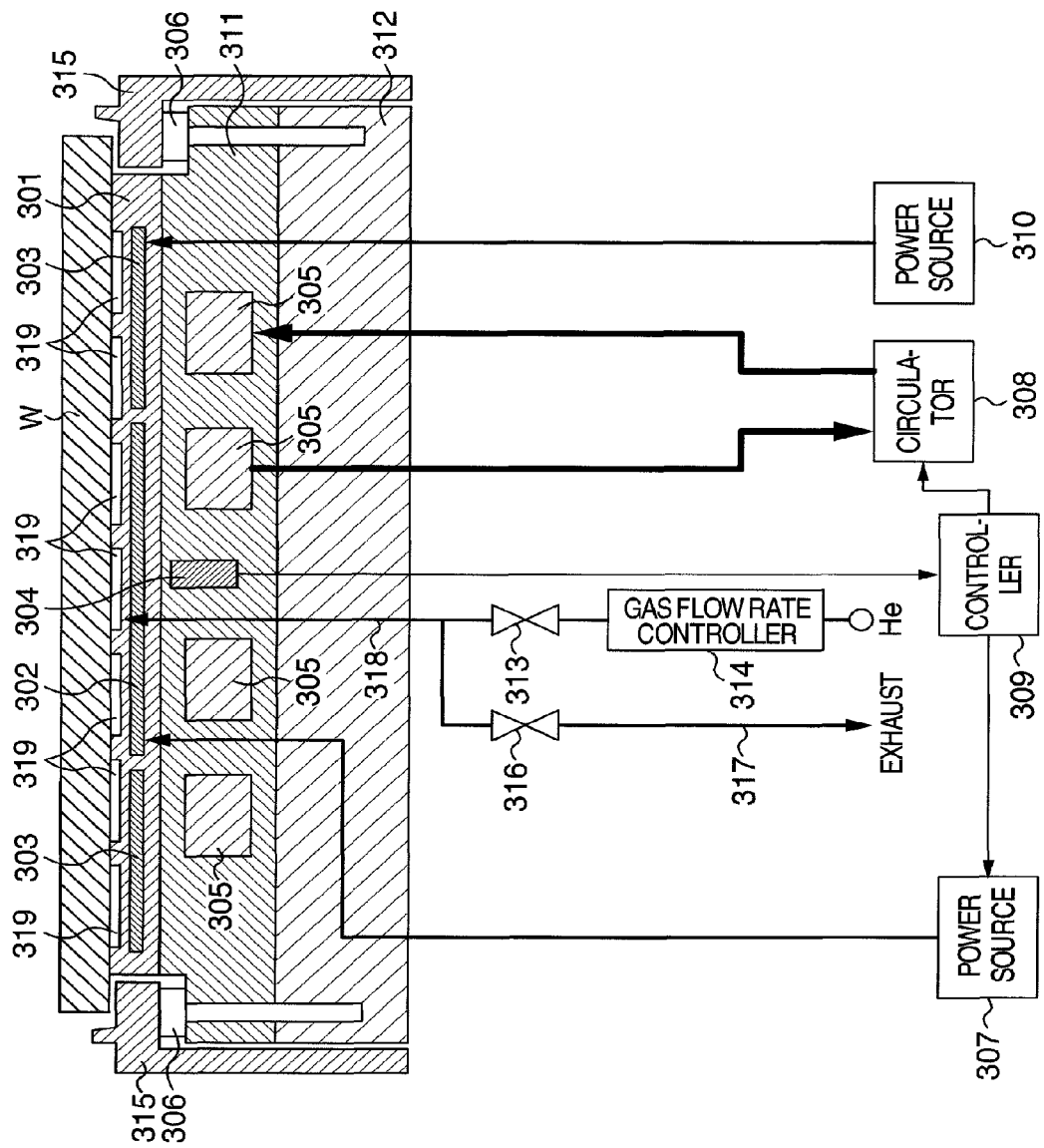
FIG. 3 is an enlarged vertical cross section of the sample stage of the plasma processing apparatus as the embodiment of this invention, shown in FIG. 2.

FIG. 3 shows in further detail the structure of the sample stage 207 and its associated components. FIG. 3 is an enlarged vertical cross section of the sample stage 207 of the plasma processing apparatus as an embodiment of this invention, shown in FIG. 2.

As shown in FIG. 3, the disk-like sample, denoted at reference symbol W, is mounted on the top surface of the dielectric film 301 formed on the top surface of the sample stage 207.

As described above, a head 311, which is a cylindrical member of electrically conductive material serving as an electrode, is embedded in the sample stage 207. A dielectric film 301 is disposed on and covering the upper surface of the top portion of the cylindrical head 311, the top portion being a cylinder integrally and concentrically formed with the cylindrical head 311 but having a little less diameter. Within the head 311 are cut multiple concentric or helical coolant ducts 305 through which heat exchange fluid is circulated. The circulation of the heat exchange fluid through the coolant ducts 305 adjusts the temperature of the head 311 within a predetermined range of values. Consequently, the temperature of the sample stage 207 is also controlled to a desired range of values.

The circulation of the heat exchange fluid is as follows: the coolant flowing out of the exit of the coolant duct 305 provided within the sample stage 207, goes via piping to a circulator 308; and the coolant, after its temperature and flow rate have been adjusted to their desired values by the circulator 308, returns via piping to the entrance of the coolant duct 305. Further in this embodiment, a plurality of film-like heaters are disposed within the dielectric film 301 or the top portion of the head 311, whereby the temperature at the top surface of the dielectric film 301 is controlled by the film-like heaters.

Also, the temperature in the top portion of the head 311 in the sample stage 207 is detected by a temperature sensor 304 disposed in the head 311. The signal outputted from the temperature sensor 304 is received via a communication means by a controller 309 located outside the sample stage 207, to detect the temperature of the sample W or the sample mounting surface of the sample stage 207. The controller 309 comprises a microprocessor such as a so-called CPU, memories such as RAMs and ROMs, a data storage device such as a hard disk drive, interfaces for exchanging signals with external devices, and communication means including wiring for connecting these components and distributing signals to them. Using the signal from the temperature sensor 304 received via the interface by the microprocessor, the controller 309 detects the temperature of the head 311 or the top surface of the dielectric film 301 of the sample stage 207 in accordance with the algorithm such as software previously stored in and read out of the data storage device; calculates electric power required to provide desired fluid temperature and flow rate and power to be supplied to the heaters; and sends out command signals to the circulator 308 and the power source for the heaters, to control their operations.

A disk-shaped sample stage base 312 is disposed on the bottom surface of the head 311 and firmly attached to the head 311 by means of a plurality of bolts 306 extending vertically from the stepped portion of the head 311 and screwed into the base 312. As shown in FIG. 3, a ring-shaped cover 315 is so disposed around the sample stage that it may cover the surface of the stepped portion of the head 311, the heads of the bolts 306, and the side walls of the head 311 and the base 312, so as to suppress their interaction with the plasma 203 generated in the processing room.

Further, film electrodes 302, 303 for electrostatic chucking are embedded in the dielectric film 301. By applying DC voltages supplied from the power sources 307, 310 to the electrodes 302, 303, the sample W is polarized in the direction of its thickness so that it is electro-statically chucked onto the upper surface of the dielectric film 301. Also, concavities or grooves having predetermined shapes are previously cut in the upper surface of the dielectric film 301. So, when the sample W is chucked onto the dielectric film 301, gap spaces 319 are left between the upper surface of the dielectric film 301 and the lower surface of the sample W.

In this embodiment, the concavities or grooves to form the gap spaces 319 are cut in the entire inner part, not along the peripheral part, of the upper surface of the dielectric film 301. With the sample W chucked onto the dielectric film 301, helium as heat exchange gas is fed into the opening located in the upper surface of the dielectric film 301 so that the gap spaces 319 are filled with helium. Thus, the supply of helium gas into the gap spaces 319 improves the efficiency in heat transfer and therefore in the heat exchange between the sample W and the dielectric film 301 (sample stage 207) and the controllability of sample temperature. The pressure of helium gas in the gap spaces 319 is kept at, for example, about 1 kPa.

If helium gas is fed into the gap spaces 319 after the sample W has been mounted onto the sample stage 207 but before the sample W has been electro-statically chucked onto the dielectric film 301, the helium gas may blow the sample W off the dielectric film 301, the sample W may slide out of place on the dielectric film 301 due to the strong leak of the helium gas from between the sample W and the dielectric film 301, or the sample W may slip off the sample stage 207, if the supply of helium gas is too much.

In this embodiment, therefore, a helium gas feed line 318, which is connected with the opening located in the inner area of the dielectric film 301, is provided with a gas exhaust line 317 which is connected with an exhaust pump to purge helium gas from the gas feed line 318 and the gap spaces 319. And excessive part of helium gas can be released by opening an exhaust valve 316 provided on the gas exhaust line 317 in response to the command sent from the controller 309. Alternatively, when helium gas is fed into the gap spaces 319 without electrostatic chucking the sample W onto the sample stage 207, the flow rate of the helium gas may be controlled by a gas flow rate controller 314 provided on the helium gas feed line 318 so that the upward force due to the gas pressure in the gap spaces 319 may not exceed the weight of the sample W itself.

Incidentally, if the pressure of gas within the space in the helium gas feed line 318 between the gas flow rate controller 314 and a helium gas feed valve 313 provided on the gas feed line 318 downstream of the controller 314, is too high, the sample W may be blown off the sample stage 207 by the strong gush of helium gas due to the excessive feed of helium gas at the moment of opening the valve 313. In this embodiment, therefore, before the gas feed valve 313 is opened, the exhaust valve 316 is opened and then the feed valve 313 is opened.

In addition to this, the conductance of the gas exhaust line 317 is set sufficiently greater than that of the gas feed line 318. Accordingly, when the exhaust valve 316 is opened, helium gas that stayed in the gas feed line 318 between the gas flow rate controller 314 and the gas feed valve 313 is almost entirely released through the exhaust line 317. Moreover, when the gas flow rate of helium is detected such that it has reached a predetermined value suitable for holding the sample W on the dielectric film 301, the command signal from the controller 309 causes the exhaust valve 316 to be closed so that helium gas is fed into the gap spaces 319.

Figure 4:
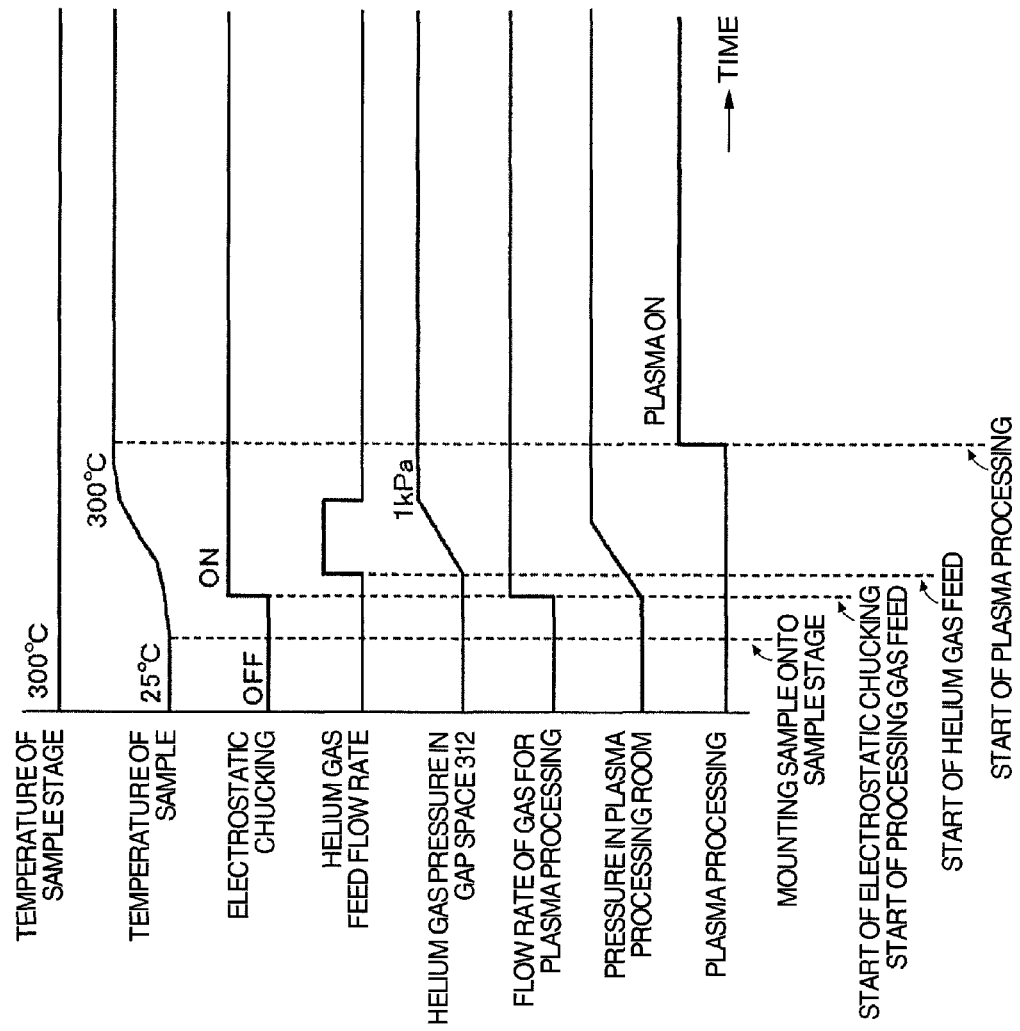
FIG. 4 is a time chart for illustrating the flow with time of operations of a typical plasma processing apparatus according to the related art.

The sequence of operations from transferring the sample into the processing room to starting plasma processing will now be described in reference to FIG. 4. FIG. 4 shows a conventional sequence generally used before the advent of this invention. In this sequence shown in FIG. 4, it is assumed that plasma processing takes place with a sample heated up to and kept at 300° C. and that the temperature of the sample was kept at a room temperature (25° C.) before it was transferred into the processing room.

As shown in FIG. 4, the temperature of the sample stage is kept at 300° C., which is a preset temperature. In this conventional technique, the sample is transferred into the processing room and mounted on the sample stage; the sample is then electro-statically chucked onto the upper surface of the dielectric film disposed on the top surface of the sample stage; helium gas as heat exchange medium is injected into the gap spaces between the bottom surface of the sample and the upper surface of the dielectric film; and the sample is heated through the heat exchange with the heat transfer medium heated by the sample stage.

Then, while processing gas is being fed into the processing room, the pressure in the processing room is adjusted within a desired range of values. When it proves that the temperature of the sample is within a range of values suitable for plasma processing, electric or magnetic field is generated in the processing room to form plasma from processing gas, and the processing of the sample starts.

In this processing operation of the conventional technique as shown in FIG. 4, the sample expands thermally when it is heated by the sample stage after it has been electro-statically chucked to the sample stage. Consequently, friction occurs between the bottom surface of the sample and the top surface of the dielectric film, the degree of friction depending on the extent of thermal expansion. This thermal expansion incurs a problem that the friction may damage the rubbing surfaces and produce fine particles of contamination material, or may change the roughness of the sample stage surface to deteriorate processing performance with time due to the change in the heat exchange efficiency between the sample and the sample stage.

Figure 5:
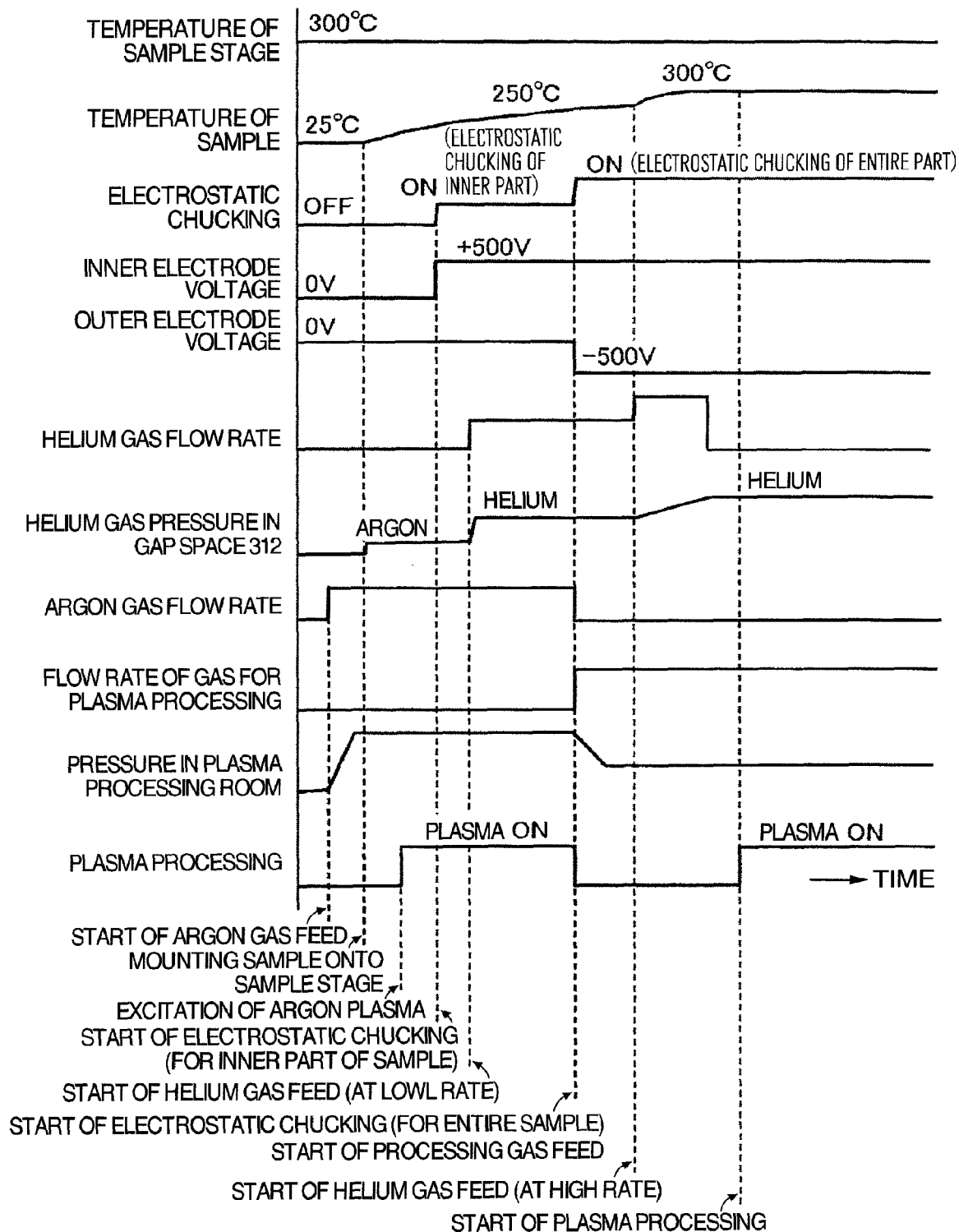
FIG. 5 is a time chart for illustrating the flow with time of operations of the plasma processing apparatus as the embodiment of this invention shown in FIG. 2.

The sequence of operations according to the plasma processing apparatus as this embodiment of the invention will now be described in reference to FIG. 5. FIG. 5 is a time chart which illustrates the sequence with time of operations of the plasma processing apparatus shown as the embodiment of this invention in FIG. 2.

According to the operational sequence of this embodiment, the sample W is heated with its part free from electrostatic chucking. Thus, the degree of abrasion or damage of the rubbing surfaces due to thermal expansion of the sample is lessened around the sample part free from electrostatic chucking. It should be noted, however, that there is a certain range of temperatures of the sample W and the dielectric film 301 within which their abrasion and damage will be tolerable even if they are electro-statically chucked to each other. Such a range of temperatures to attain the tolerable abrasion and damage will depend on the type of sample, the condition of plasma processing, and the material of the sample stage.

In this embodiment, the sample W kept at a room temperature (25° C.) is mounted on the sample stage 207 kept at a predetermined high temperature (e.g. 300° C.) and held there without electro-statically chucking a part thereof. While the sample is held on the sample stage, the sample W is gradually heated due to the heat transmission between the sample W and the dielectric film 301 of the sample stage 207, especially, due to the heat transmission at the electro-statically chucked portion of the sample.

When it is determined that the sample W has been heated up to a desired temperature (250° C.) near the predetermined temperature mentioned above, the part of the sample W free from electrostatic chucking until then is now electro-statically chucked onto the dielectric film 301. After the entire body of the sample W has been heated up to 300° C., i.e. a temperature suitable for starting plasma processing, etching process is started. In this embodiment, the pressure of the helium gas fed into the gap spaces between the sample W and the dielectric film 301 is kept at 1 kPa.

In the above embodiment, during the time period from the moment that the sample W kept at a room temperature (25° C.) is mounted on the sample stage 207 until the moment that it reaches a predetermined temperature of 250° C., a part of the sample W is not electro-statically chucked to the dielectric film 301. Accordingly, the abrasion and damage of the rubbing surfaces that may be otherwise appreciable due to the thermal expansion of the sample W and the dielectric film 301, will be reduced to a negligible extent. While the sample W is heated from 250° C. to 300° C., the entire sample W including that part free from electrostatic chucking until then is electro-statically chucked to the dielectric film 301 so that friction occurs between the sample W and the dielectric film 301 in accordance with the difference in thermal expansion between the sample W and the dielectric film 301. According to this embodiment, however, it is determined that the temperature range that can cause such tolerable abrasion and damage is not greater than 50° C.

Figure 6:
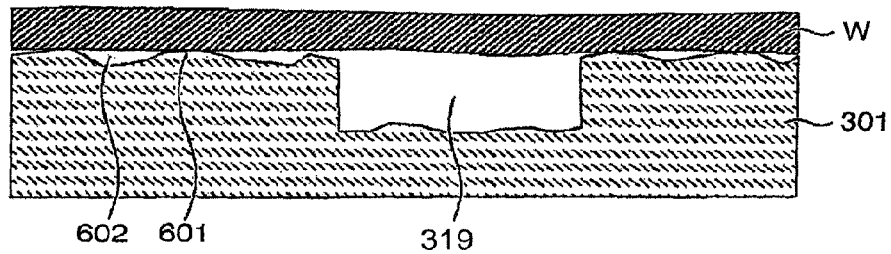
FIG. 6 is an enlarged vertical cross section of the portion of contact between the sample and the sample stage in the plasma processing apparatus as the embodiment of this invention shown in FIG. 2.

As shown in FIG. 6, since the facing surfaces of the sample W and the dielectric film 301 have their specific roughness, when they come in contact with each other, there exist points 601 of contact and fine gaps 602 according to the roughness of the facing surfaces. In the operations as shown in FIG. 5, when the sample W is heated through heat exchange with the sample stage 207 while the sample W is not yet electro-statically chucked to the sample stage, the internal space of the processing room is maintained in a state of high vacuum, i.e. at an extremely low pressure, the fine gaps 602 are also kept in a state of high vacuum, i.e. at an extremely low pressure. Hence, the degree of heat transfer across the fine gaps 602 is very low. Consequently, heat transfer between the sample W and the dielectric film 301 takes place only through the points 601 of contacts. However, the aggregate area of those points 601 of contacts is extremely small as compared with the entire area of the lower surface of the sample W, so that the efficiency of heat transfer between the sample W and the sample stage 207 is low, too. In this circumstance, if it is desired to heat the sample W from a room temperature up to a predetermined temperature (e.g. 250° C.), a long time is consumed. Thus, helium gas as heat exchange medium is fed into the gap spaces between the sample W and the dielectric film 301 in the state that the remaining portion other than the part of the rear surface of the sample W is electro-statically chucked to the dielectric film 301 to thereby increase the temperature of the sample W by the heat transmitted from the sample stage 207. The helium gas may be supplied so as to be spread over the entirety of the rear surface of the sample W. Alternatively, as described later, the helium gas may be supplied only to a particular portion of the rear surface of the sample W such as the electro-statically chucked portion in accordance with the margin of the processing time of a plurality of the samples W. In this embodiment, at least the two openings for introducing helium gas are located in the inner areas of the dielectric film 301, that is, the electro-statically chucked portion and the portion free from electrostatic chucking, respectively.

In this way, if a long time is required for the heating of a sample W, the processing time from the mounting of the sample W on the sample stage till the completion of plasma processing will be elongated. On the other hand, however, if the processing time is sufficiently short as compared with the time required for the transfer and post-processing cooling of the sample W, its influence on the entire time of handling the sample W, i.e. time from transferring the sample W out of the associated cassette till returning the processed sample W to the original cassette, will be relatively small.

In the embodiment shown in FIG. 3, the film-like electrodes embedded in the dielectric film 301 for electrostatic chucking include an inner electrode 302 and an outer electrode 303. The inner electrode 302 and the outer electrode 303 are electrically connected with dedicated power sources 307, 310, respectively. These electrodes are provided with opposing polarities during processing, and the area of the inner electrode is equal to the area of the outer electrode, as seen from above.

In other words, as seen from above, the inner electrode 302 is a circle disk with its center located at the center of the mounting surface of the sample stage 207 while the outer electrode 303 is an annular ring encircling the inner electrode 302. The circumference of the inner electrode 302 is disposed as close to the inner perimeter of the outer electrode 303 as possible, and the radius of the circumference of the inner electrode 302 is in a predetermined ratio to the radius of the outer perimeter of the outer electrode 303.

In this embodiment, these power sources are DC sources. If a positive potential is applied to the inner electrode 302 and a negative potential is given to the outer electrode 303, then an electric circuit is established having a potential difference and extending from the inner electrode 302 through the sample W to the outer electrode 303. Accordingly, electric polarization takes place in the sample W and in the part of the dielectric film 301 over the electrodes 302, 303 so that the sample W is electro-statically chucked onto the dielectric film 301.

In the embodiment thus structured, the sample W is mounted on the dielectric film 301, gas is fed into the processing room, and only the inner electrode 302 is provided with power (e.g. +500 V) from the power source 307 while plasma 203 is being excited. Under this condition, an electric circuit is established through the inner electrode 302, the sample W, the plasma 203, and the grounded vacuum vessel

204. Consequently, the sample W is electro-statically chucked to the dielectric film 301 due to the electrostatic force corresponding to the electric charges induced by the polarization generated in the sample W. This state is that the sample W is electro-statically chucked to the dielectric film 301 using the inner electrode 302 as a monopole electrostatic chucking electrode.

It should be noted that the sample W is not processed with the plasma 203 during this electrostatic chucking. Further, inert gas such as argon may be fed into the processing room to form plasma 203 for generating electrostatic force for electrostatic chucking. Furthermore, as plasma is formed after processing gas has been fed, the sample W may be subjected to electrostatic chucking and ensuing heating without applying a high-frequency bias power to the head 311.

In such a case, the electrostatic chucking force induced between the sample W and the dielectric film 301 is generated only in that area of the upper surface of the dielectric film 301 which lies only directly above the inner electrode 302. And there is scarcely generated electrostatic chucking force in that area of the upper surface of the dielectric film 301 which lies directly above the outer electrode 303 that is not provided with power. In this circumstance, helium gas is fed via the gas feed line 318, through the opening cut in the upper surface of the dielectric film 301, into the interstice between the sample W and that area of the upper surface of the dielectric film 301 which lies only directly above the inner electrode 302.

The bottom surface of the sample W is electro-statically chucked to that area of the upper surface of the dielectric film 301 which lies only directly above the inner electrode 302. And the area of contact between the sample W and the dielectric film 301 in this case is far greater than the area of contact between that part of the bottom surface of the sample W which lies directly above the outer electrode 303 and that part of the upper surface of the dielectric film 301 which also lies directly above the outer electrode 303. In addition, since helium gas fed into the interstice between the sample W and that area of the upper surface of the dielectric film 301 which lies only directly above the inner electrode 302, serves as a good heat exchange medium and promotes the heat exchange between the sample W and the sample stage 207 so that the heating of the sample W can be completed in a shorter time as compared with the part of the bottom surface of the sample W free from electrostatic chucking above the outer electrode 303. When the sample W is heated up to a predetermined temperature suitable for plasma processing or when a predetermined length of time lapses for heating the sample W, powers of different polarities are supplied to the inner and outer electrodes 302, 303 in response to command signals from the controller 309 so that the sample W as a whole is electro-statically chucked to the upper surface of the dielectric film 301.

In this case, for example, voltages of +500V and −500V are applied respectively to the inner and outer electrodes 302, 303. After the sample W as a whole has been electro-statically chucked to the upper surface of the dielectric film 301, helium gas is fed via the gas feed line 318 into the fine gaps 602 between the sample W and that area of the upper surface of the dielectric film 301 which lies directly above the outer electrode 303 so that the heat transfer between the bottom surface of the sample W and the dielectric film 301 is promoted to effectively heat the sample W. When the controller 309 determines in response to the signal from the temperature sensor 304 that the temperature of the sample W has reached a predetermined value suitable for starting a desired processing, the controller 309 delivers a command signal, which causes the processing of the sample W to start.

The inner electrode 302 according to this embodiment has a circular shape, and is located in the central part of and beneath the sample mounting surface of the dielectric film 301, and also the inner electrode 302 has a predetermined small radius such that when the sample W is mounted on the sample stage 207, a small area around the center of the sample W covers the inner electrode 302. The predetermined small radius has at least such a dimension as to effectuate realistic heat transfer between the sample W and the dielectric film 301 and to provide a minimum electrostatic chucking area that can prevent the sample W from floating over the dielectric film 301 against the upward force exerted to the sample W when helium gas is fed into the interstice in this area. In this embodiment, the predetermined small radius is chosen to be equal to or more than 5%, or preferably 10%, of the radius of the sample W or the sample mounting surface of the sample stage 207. In the embodiment shown in FIG. 3, power is supplied only to the inner electrode 302 while helium gas is being fed over the inner electrode 302 to heat the sample W. Since the radius of the inner electrode 302 is equal to about $1/\sqrt{2}$ times the radius of the outer perimeter of the outer electrode 303, the radius of the inner electrode 302 is larger than the minimum value of the predetermined small radius.

According to this embodiment, since the sample W is electro-statically chucked to the mounting surface of the sample stage 207 only in the area close to the inner electrode 302, the sample W can be prevented from dropping from the sample stage 207 or moving from its right position on the sample stage 207 even when helium gas is fed into the interstice between the sample W and the dielectric film 301 via a opening provided in the area over the inner electrode 302. Consequently, the pressure of helium gas in the gap spaces 319 can be increased so that the efficiency of heat transfer between the sample W and the sample stage 207 can be improved. Further, the electrostatic chucking force between the sample W and the dielectric film 301 exists only in the area close to the inner electrode 302. When the sample W is heated, the degree of its expansion is zero at its center and increases as the radial distance from the center increases. Since only the central part of the sample W or the dielectric film 301, where thermal expansion is relatively small, is electro-statically chucked, abrasion between or damage to, the sample W and the dielectric film 301 will be decreased.

Moreover, since the sample W is not electro-statically chucked to the dielectric film 301 in its area of the bottom surface over the outer electrode 303, helium gas fed into the gap spaces 319 between the sample W and the dielectric film 301 diffuses into those gap spaces 319 existing over the outer electrode 303 and leaks from the peripheral area of the sample W into the internal space of the processing room. In the meantime, the sample W is heated through heat transfer from the sample stage to the sample with the helium gas used as heat transfer medium passing through the gap spaces 319 existing between the sample W and the dielectric film 301. When the sample W is heated up to 250° C., the outer electrode 303 is also powered so as to electro-statically chuck the whole body of the sample W to the dielectric film 301. Subsequently, heat transfer gas is fed into the gap spaces 319 until the gas pressure in the gap spaces 319 reaches a predetermined value, say, 1 kPa; the sample W is heated until it reaches a predetermined temperature (300° C.); and the etching of a desired film of the sample W is started under a predetermined condition.

Figure 7:
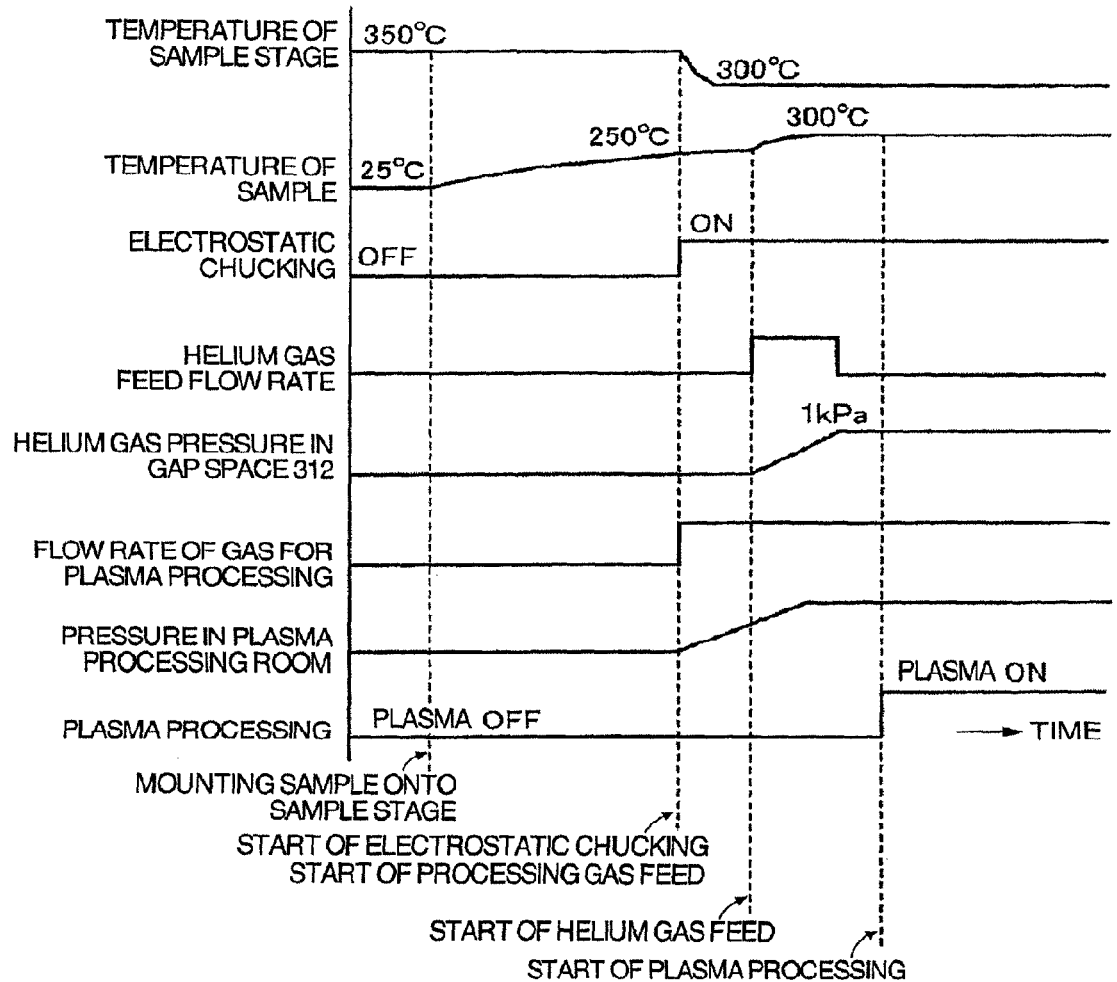
FIG. 7 is a time chart for illustrating the flow with time of operations of a plasma processing apparatus as a first modified version of the embodiment of this invention shown in FIG. 2.

As shown in FIG. 7, the sample W may be mounted on the sample stage 207, which was kept at, for example, 350° C. before the sample W is transferred into the processing room, and then heated up to 250° C. as in the above embodiment.

Figure 8:
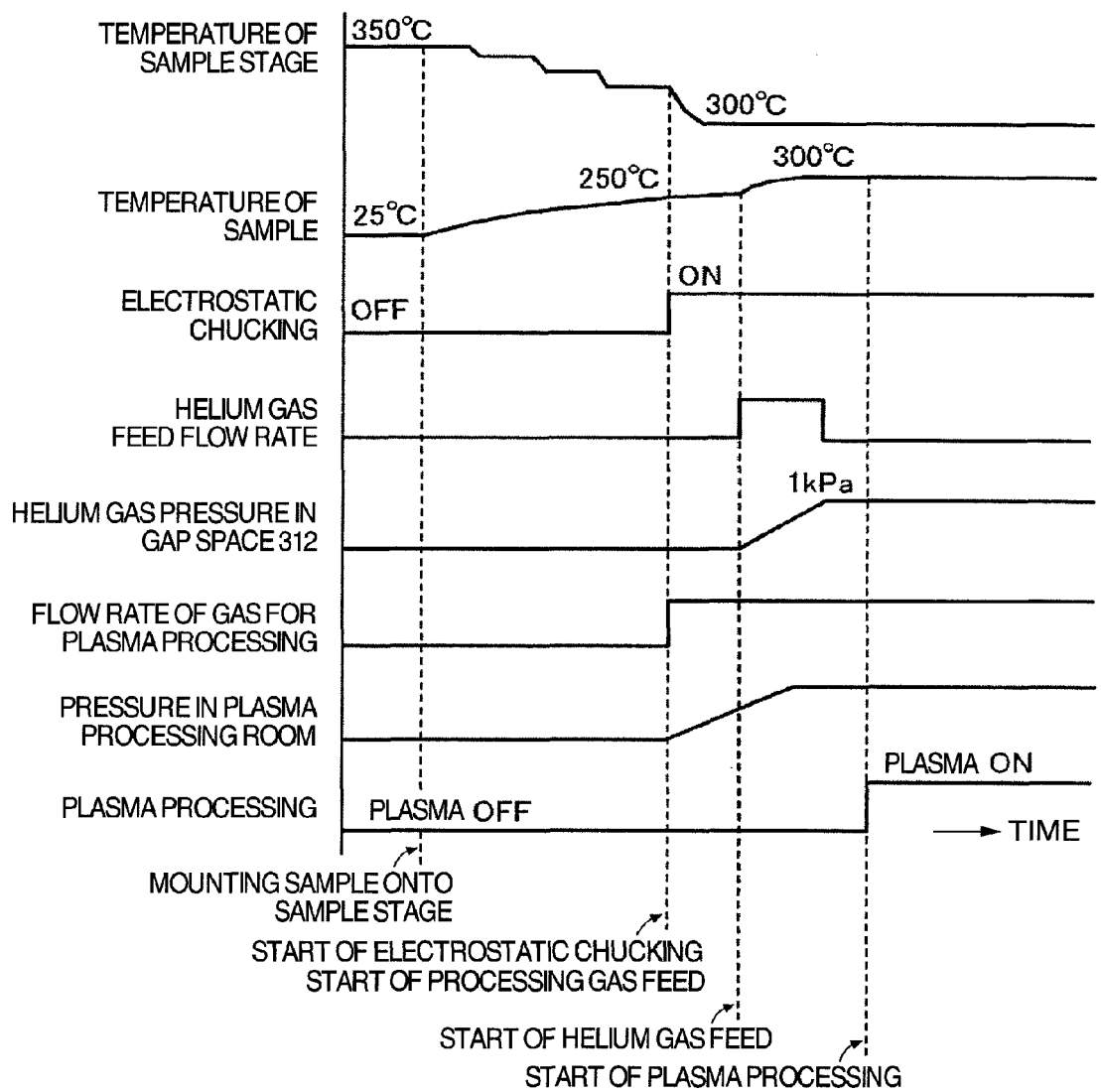
FIG. 8 is a time chart for illustrating the flow with time of operations of a plasma processing apparatus as a second modified version of the embodiment of this invention shown in FIG. 2.

When the temperature of the sample W reaches 250° C., the temperature of the sample stage is adjusted to 300° C. The entire part of the sample W is then electro-statically chucked to the dielectric film 301 and helium gas is fed into the interstice over the outer electrode 303 between the sample W and the dielectric film 301. When the temperature of the sample W reaches 300° C., plasma processing may be started. Further, as shown in FIG. 7, the temperature of the sample stage is lowered from 350° C. to 300° C. in a short time, but the temperature of the sample stage may be lowered gradually from its initial temperature (350° C.) to 300° C., as shown in FIG. 8. Alternatively, while the sample temperature is monitored, the temperature of the sample stage 207 may be automatically controlled so that the temperature of the sample W can reach 300° C. at the fastest speed.

Modified Embodiment 1

Figure 9:
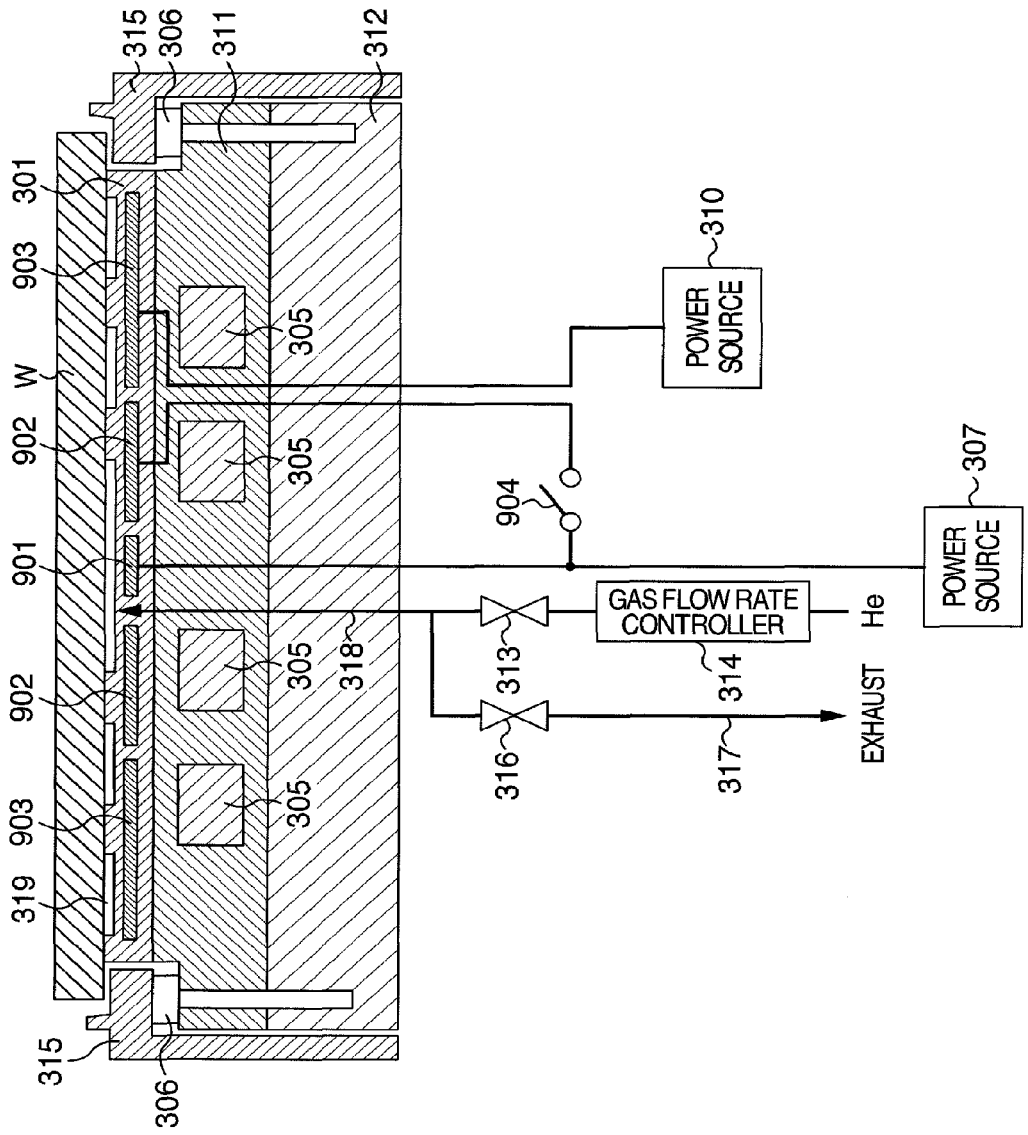
FIG. 9 schematically shows in vertical cross section the structure of the sample stage according to the first modified version of the embodiment of this invention shown in FIG. 2.

A modified version of the above described embodiment is described in reference to FIG. 9. FIG. 9 schematically shows in vertical cross section the structure of a sample stage used for a plasma processing apparatus which is a first modified version of the embodiment shown in FIG. 2. In FIG. 9, the description of those parts which appear in FIG. 3 is omitted and only different parts are described below.

This modified embodiment differs from the above-described embodiment in that the inner electrode consists of, at least, multiple electrodes separated in the radial direction and laid out concentrically with respect to the center of the sample stage. In this modification, the inner electrode 302 described with the above-described embodiment is split into two parts: one is an innermost circular electrode 901 and the other is an intermediate ring-shaped electrode 902 encircling the innermost circular electrode 901. The innermost circular electrode 901 and the intermediate ring-shaped electrode 902 are electrically connected with the same power source 307.

In this modified embodiment, too, the sample W is mounted on the dielectric film 301 covering the sample stage 207; only the inner part of the lower surface of the sample W is electro-statically chucked to the upper surface of the dielectric film 301; heat transfer gas is fed into the interstice between the sample W and the dielectric film 301; the sample W is then heated up to a predetermined temperature (e.g. 250° C.); the outer part of the sample W, which was not electro-statically chucked to the dielectric film 301, is now electro-statically chucked to the dielectric film 301; the sample W is heated again up to a temperature suitable for the start of processing; and the sample W is subjected to plasma processing. However, in this modified embodiment, it is that part of the bottom surface of the sample W which lies directly over the innermost electrode 901, that is electro-statically chucked to the upper surface of the dielectric film 301 for the purpose of ensuing heating of the sample W.

In other words, of the innermost electrode 901 and the intermediate electrode 902 which are both supplied with power of polarity different from that of power supplied to the outer electrode 903, only the innermost electrode 901 is powered. In fact, the switch 904 for connecting the power source 307 with the intermediate electrode 902 is turned off to cut electric connection between them. Accordingly, power from the source 307 is supplied only to the innermost electrode 901. In this state, plasma 203 is generated in the processing room and that part of the bottom surface of the sample W which lies directly over the innermost electrode 901 is electro-statically chucked to the dielectric film 301. Then, the helium gas is fed into the gap spaces 319 between the sample W and the dielectric film 301 through the gas feed line 318 having its opening near the innermost electrode 901. The helium gas promotes heat transfer between the sample W and the sample stage 207 in the process of heating the sample W. It should be noted here that the radius of the circular innermost electrode 901 is set larger than the minimum radius that is required from the view point of electro-statically chucking the sample W. Moreover, the helium gas is also fed into the spaces between the sample W and the electrodes 902 and 903, whereby heat transmission is performed between the sample W above the innermost electrode 901 and the dielectric film 301 to thereby heat the sample W although an amount and a speed of the heat transmission therebetween is relatively low and small.

When it is determined, on the basis of the output signal from the temperature sensor 304, that the temperature of the sample W has reached a predetermined value (250° C.), the switch 904 is closed in response to the command signal from the controller 309 so that both the innermost electrode 901 and the intermediate electrode 902 are powered. Further, the ring-shaped outer electrode 903 laid out encircling the intermediate electrode 902 is supplied with power from the power source 310 the polarity of which is different from the polarity of power supplied to the innermost electrode 901 and the intermediate electrode 902. Consequently, an electric circuit is established through the innermost electrode 901, the intermediate electrode 902, the sample W and the outer electrode 903, and the sample W is electro-statically chucked to the upper surface of the dielectric film 301 due to the electrostatic force generated owing to the electric charges induced as a result of polarization caused within the sample W.

In this state, the helium gas fed through the gas feed line 318 is filled with a high pressure in all the gap spaces 319 under the bottom surface of the sample W to enhance the heat transfer between the sample W and the sample stage 207. When it is determined that the temperature of the sample W has reached a predetermined value suitable for starting plasma processing, etching process using plasma is started. Like the aforesaid embodiment, helium gas may be fed and retained only into the area of the rear surface side of the sample W which lies only directly above the electrode 901, then the helium gas may be filled over the entirety of the rear surface side of the sample after heating the sample W to a predetermined temperature to thereby heat again the sample W to the temperature suitable for the processing.

Modified Embodiment 2

Figure 10:
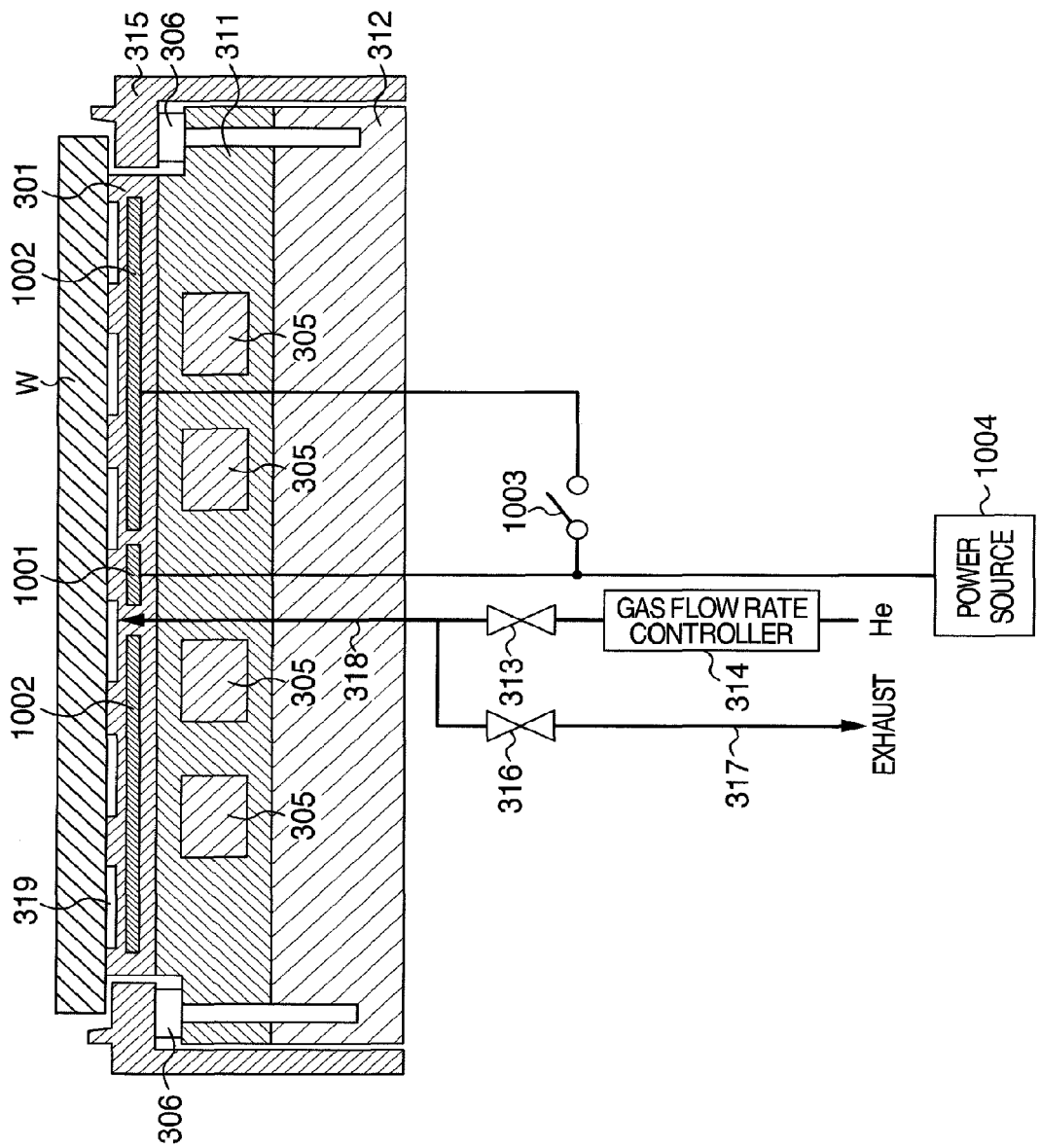
FIG. 10 schematically shows in vertical cross section the structure of the sample stage according to the second modified version of the embodiment of this invention shown in FIG. 2.

A second modified version of the above-described embodiment will be described in reference to FIG. 10. FIG. 10 schematically shows in vertical cross section the structure of a sample stage used in a plasma processing apparatus according to a second modified version of the embodiment shown in FIG. 2. Concerning this second modified embodiment, the description of those parts or items which appear in FIGS. 3 and 9 is omitted, and only different parts or items will be described below.

This second modification differs from the first modification described above in that a plurality of film-like electrodes embedded in the dielectric film 301 for electrostatic chucking are connectable electrically with a single power source 1004 so that power of a polarity can be supplied to both the film-like electrodes. In this embodiment, a circular inner electrode 1001 and a ring-shaped outer electrode 1002 concentrically encircling the circular inner electrode 1001 are laid out in the dielectric film 301 covering a substantially circular area corresponding to the sample W of disk-shape. The inner electrode 1001 and the outer electrode 1002 can be electrically connected with the same power source 1004. When the sample W is processed, an electric circuit is established through both the inner and outer electrodes 1001, 1002, the sample W and the plasma 203 so that the sample W is electro-statically chucked to the dielectric film 301 due to the electrostatic force generated owing to the electric charges induced as a result of polarization caused within the sample W.

In this second modification, too, the sample W is transferred into the processing room; the sample W is mounted on the dielectric film 301 covering the sample stage 207; the electrostatic chucking takes place only in a part of the bottom surface of the sample W or the top surface of the dielectric film 301; and the sample W is heated. In fact, when the sample W is mounted on the dielectric film 301, the switch 1003 is opened so that power form the source 1004 is supplied only to the inner electrode 1001 which covers only a small circular area of the top surface of the dielectric film 301 that is located in the center of the sample stage 207. The radius of the circular inner electrode 1001 is set equal to or larger than the minimum radius that is required from the view point of electro-statically chucking the sample W.

In this state, plasma 203 is generated in the processing room and only a small circular area in the central part of the bottom surface of the sample W is electro-statically chucked to the top surface of the dielectric film 301 by using the inner electrode 1001 as a monopole electrostatic chucking electrode. Then, helium gas is fed into the interstice under the bottom surface of the sample W through the gas feed line 318 having its opening near the center of the dielectric film 301 to enhance the heat transfer between the sample W and the sample stage 207, and the sample W is heated up to a predetermined temperature (250° C.).

Thereafter, the switch 1003 is closed to supply power from the power source 1004 to the outer electrode 1002. Then, the inner electrode 1001 and the outer electrode 1002 work as monopole electrostatic chucking electrodes having the same polarity, and subsequently that area of the bottom surface of the sample W which lies over the outer electrode 1002, which was not electro-statically chucked to the dielectric film 301 until then, now generates electrostatic chucking force so that the entire bottom surface of the sample W is electro-statically chucked to the upper surface of the dielectric film 301. In this state, helium gas is fed into the interstice under the entire bottom surface of the sample W, and therefore the heat transfer across the entire bottom surface of the sample W is improved. Then, the sample W is heated up to a temperature suitable for starting plasma processing, and finally etching process is started using plasma.

Modified Embodiment 3

Figure 11:
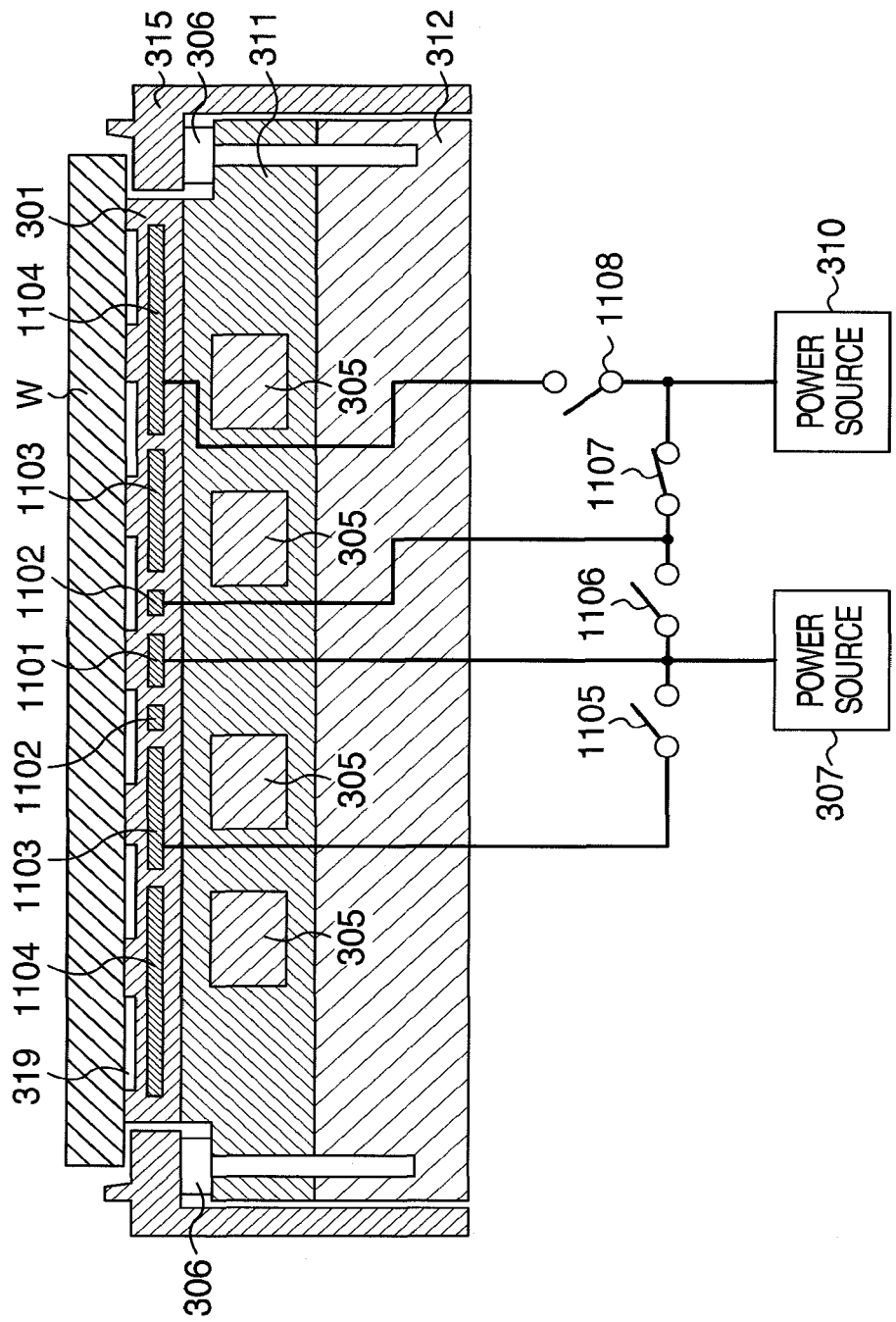
FIG. 11 schematically shows in vertical cross section the structure of the sample stage of a plasma processing apparatus as a third modified version of the embodiment of this invention shown in FIG. 2.

A third modified version of the above-mentioned embodiment shown in FIG. 2 will now be described in reference to FIGS. 11 and 12. FIGS. 11 and 12 schematically show in vertical cross section the structure of a sample stage used in a plasma processing apparatus according to a third modified version of the embodiment shown in FIG. 2. Concerning this third modified embodiment, the description of those parts or items which appear in FIGS. 3, 9 and 10 is omitted, and only different parts or items will be described below.

This third modification differs from the modifications described above with FIGS. 9 and 10 in that a plurality of film-like electrodes embedded in the dielectric film 301 for electrostatic chucking are connected electrically with different power sources 307 and 310 so that two different polarities can be selectively provided for those film-like electrodes. According to this third modified embodiment, as shown in FIGS. 11 and 12, an innermost electrode 1101, a first intermediate electrode 1102, a second intermediate electrode 1103, and an outer ring-shaped electrode, all disposed in the dielectric film 301, can be selectively connected with the two power sources 307 and 310.

To be concrete, the innermost electrode 1101 has a small circular shape and disposed in the dielectric film 301, with its center located at the center of the sample W or the dielectric film 301. The first intermediate electrode 1102 is ring-shaped and concentrically encircles the innermost circular electrode 1101, the second intermediate electrode 1103 is ring-shaped and concentrically encircles the first intermediate ring-shaped electrode 1102, and an outer electrode 1104 is ring-shaped and concentrically encircles the second intermediate ring-shaped electrode 1103. The first and second intermediate electrodes are supplied with power from the power source 307 and therefore provided with polarity different from that of the outer electrode when the sample W is processed.

The outer electrode 1104 is electrically connected via a switch 1108 with the power source 310. Further, the first intermediate electrode 1102 can be electrically connected via a switch 1107 with the power source 310 and can also be electrically connected via a switch 1106 with the power source 307. The second intermediate electrode 1103 can be electrically connected via a switch 1105 with the power source 307.

With this circuit construction, the first intermediate electrode 1102 can be supplied with power from either the power source 307 or 310 through the selective operations of the switches 1106 and 1107. As a result, the first intermediate electrode 1102 can be selectively provided with one of the two polarities: one is the same as that of the innermost electrode 1101 and the other is the same as that of the outer electrode 1104. In this third modified embodiment, when the sample W is transferred into the processing room and then mounted on the dielectric film 301 covering the sample stage 297, the switches 1105, 1106, 1108 are opened and the switch 1107 is closed as shown in FIG. 11, so that since the innermost electrode 1101 and the first intermediate electrode 1102 are powered respectively by the power source 307 and the power source 310, they are provided with different polarities. The opening and closing of these switches 1105, 1106, 1107, 1108 is performed in response to the command signals from the controller 309.

In this state, an electric circuit is established through the innermost electrode 1101, the sample W and the first intermediate electrode 1102 so that the sample W is electro-statically chucked to the dielectric film 301 due to the electrostatic force generated owing to the electric charges induced as a result of polarization caused within the sample W. At this time, the outer electrode 1104 is not supplied with power from the power source 310. Accordingly, the sample W is electro-statically chucked to the top surface of the dielectric film 301 only in that part of the bottom surface of the sample W which lies directly over the innermost electrode 1101 and the first intermediate electrode 1102 and which alone generates electrostatic chucking force in this case. Then, helium gas is fed into the gap spaces 319 lying directly above the intermediate electrode 1102 between the sample W and the dielectric film 301 through the gas feed line 318 having its opening located somewhere in that area of the top surface of the dielectric film 301 which lies directly over the innermost electrode 1101 or the first intermediate electrode 1102. Consequently, the heat transfer between the sample W and the sample stage 207 is improved in heating the sample W. It should be noted that the total area of the innermost electrode 1101 and the first intermediate electrode 1102 is set larger than the circle having the required minimum radius mentioned above.

When it is determined that the temperature of the sample W has reached a predetermined value (e.g. 250° C.), the switches 1105, 1106, 1107, 1108 are changed over to supply the power of the source 307 to the innermost electrode 1101, the first intermediate electrode 1102 and the second intermediate electrode 1103, and the power of the source 310 to the outer electrode 1104. Consequently, one polarity is provided for the innermost electrode 1101, the first intermediate electrode 1102 and the second intermediate electrode 1103 while the other polarity is provided for the outer electrode 1104. Thus, the entire sample W is electro-statically chucked and held to the top surface of the dielectric film 301.

In this way, according to this third modification, too, the sample W is transferred into the processing room; the sample W is mounted on the top surface of the dielectric film 301 on the sample stage 207; the sample W is electro-statically chucked to the dielectric film 301 only in a part of area of the bottom surface of the sample W or the top surface of the dielectric film 301; and the sample W is heated while being held in that way. Further, when it is determined that the temperature of the sample W has reached a predetermined value, the entire bottom surface of the sample W is electro-statically chucked to the top surface of the dielectric film 301; the sample W is heated up to a temperature suitable for starting plasma processing; and the sample W is finally subjected to plasma etching. Like the aforesaid embodiments and modifications, helium gas may be fed and retained only into the area of the rear surface side of the sample W being electro-statically chucked, then heat is transmitted from this area heated from the sample stage 207 to the entirety of the sample W to thereby heat the sample W. Alternatively, helium gas may be fed into other area of the rear surface side of the sample W free from the electrostatic chucking or the entirety of the rear surface side of the ample W so as to enlarge the degree of heat transmission between the sample W and the sample stage 207 to thereby promote the heating and heat up the sample, then the other area of the rear surface side of the sample may be electrostatically chucked to thereby heat again the sample W to the temperature suitable for the processing. At least the two openings for introducing helium gas are located in the inner areas of the dielectric film 301, that is, the electro-statically chucked portion and the portion free from electrostatic chucking, respectively.

In this third modified embodiment, too, the electrostatic chucking of the sample W takes place only in the area directly over the innermost electrode and its vicinity so that the sample W is prevented from dropping from the sample stage 207 due to floatation by the gas injected in the interstice between the sample W and the dielectric film 301 and also from being displaced from the right position on the sample stage. Consequently, the pressure of gas in the gap spaces 319 can be increased to enhance the degree of heat transfer between the sample W and the sample stage 207. Further, the electrostatic chucking force between the sample W and the dielectric film 301 is generated only in that area of the top surface of the dielectric film 301 which lies directly over the innermost electrode 1101, or its vicinity. The thermal expansion of the sample W, when it is heated, is zero at the center thereof, whereas the degree of expansion increases as the radial distance from the center increases. Therefore, by electro-statically chucking only the central portion or its vicinity of the sample W or the dielectric film 301, the abrasion between or the damages to, the sample W and the dielectric film 301 can be suppressed.

It should be noted in the above embodiment and its modified versions that the electrostatic chucking pressure (i.e. force per unit area) required for the partial chucking of the sample W during the process of heating is set smaller than the electrostatic chucking pressure (i.e. force per unit area) required for the entire chucking of the sample W during plasma processing, or, in other words, that the sum of the pressures over the partially chucked area (i.e. force) for the heating of the sample W is set smaller than the sum of the pressures over the entirely chucked area (i.e. force) for the plasma process.

Moreover, as described in the above modified embodiments, that area of the bottom surface of the sample W which is electro-statically chucked to the top surface of the dielectric film 301 during sample heating before plasma process is set smaller than that area of the bottom surface of the sample W which is electro-statically chucked to the top surface of the dielectric film 301 during plasma process. In those cases, however, the area of electrostatic chucking may be split into multiple subareas where multiple electrodes for electrostatic chucking are disposed. In such cases, it is desirable to lay out the subareas in a concentric manner such that the displacement of the sample W within the rear plane thereof due to thermal expansion may take place monotonously or uniformly in the radial direction outward from electro-statically chucked area as the temperature of the sample W rises.

Even when the subareas are not disposed concentrically or electrostatic chucking takes place in a single area, that is, when the subarea is configured in a bold U-shape, for example, the single area should preferably takes a shape such that the length of the shortest one among respective lines, each coupling between a point on its inner periphery and another point on the inner periphery so as not to pass the subarea, is equal to or smaller than a predetermined distance. For example, since the directions of the displacements taking place from these two points are opposite to each other, the bottom surface of the sample W is displaced upward due to the thermal expansion if the distance between the two points is equal to or greater than a predetermined distance. Accordingly, there occurs a risk that the bottom surface of the sample W separates from the top surface of the dielectric film 301 to such an extent that electrostatic chucking force cannot be sufficiently exerted between the sample W and the dielectric film 301. In the above embodiment and modified examples, such a distance between two points is set equal to or less than 100 mm.

Furthermore, in the above embodiment and modified embodiments, the sample W is heated using the heat transfer from the plasma 203 or the sample stage 207 during the time period from the moment that the sample W transferred into the processing room is mounted on the sample stage to the moment that plasma processing is started. Each of the above embodiment and modified embodiments can also be applied to a case of cooling the sample W. In such a case, too, where multiple layers formed in the sample W are individually processed one by one in multiple steps using different processing conditions, the above embodiment and modified embodiments can be likewise applied to those steps when it is desired to control the temperature of the sample W in each step, especially to heat or cool the sample W up to a predetermined temperature suitable for plasma processing. In fact, the following procedure may be possible: upon completion of one processing step, only a par of the sample W is electro-statically chucked; heat transfer gas is fed into the interstice under the bottom surface of the sample W; the sample W is then heated up to a predetermined temperature; the entire body of the sample W is further electro-statically chucked; the sample W is again heated up to a temperature suitable for plasma processing; and finally the sample W is processed with plasma using processing gas.

The series of repeated operations of the electrostatic chucking and heating of the sample W in such processing steps are detailed as follows. Upon completion of the first processing step, the processing room is evacuated and then replacement gas such as inert gas is fed into the processing room. The supply of power to the electrostatic chucking electrodes is cut off. In this state, the feed of heat transfer gas such as helium gas is also at a halt. Further, after the temperature of the sample stage 207 or the dielectric film 301 has been adjusted to a value suitable for the second processing step, inert gas such as, for example, argon gas is fed into the processing room, and plasma is generated in the processing room. Then, only inner ones of electrostatic chucking electrodes are energized to electro-statically chuck only the inner part of the bottom surface of the sample W. In this state, helium gas is fed into the interstice between that part of the bottom surface of the sample W and that part of the top surface of the dielectric film 301, which both lie directly over the energized electrostatic chucking electrodes. When it is determined that the temperature of the sample W is within a predetermined range of values, the outer electrostatic chucking electrodes are also energized so that the entire sample W is subjected to electrostatic chucking Subsequently, helium gas is fed into the interstice under the bottom surface of the sample W and the second processing step is started for the sample W.

Alternatively, in the case where the sample W is electro-statically chucked by the inner electrostatic chucking electrode of bipolar type for the purpose of heating thereof, the processing room is evacuated while the above mentioned gas is being replaced, upon completion of the first processing step. Subsequently, the temperature of the sample stage 207 is changed or the sample W is heated while it is being electro-statically chucked by the inner electrostatic chucking electrode of bipolar type and the temperature of the sample stage 207 is being changed. When the sample W is heated up to a predetermined temperature, the entire body of the sample W may be chucked and then the second processing step may be initiated.

The invention claimed is:

1. A plasma processing apparatus comprising:
   a processing chamber disposed in a vacuum vessel, the processing chamber being depressurized and plasma being generated therein;
   a sample stage located in a lower portion in the processing chamber, on a top surface of which a sample to be processed with the plasma is mounted;
   a dielectric film disposed on the top portion of the sample stage, the dielectric film constituting a sample mounting surface of the sample stage;
   a plurality of electrodes embedded inside of the dielectric film for chucking the sample to the upper surface of the dielectric film while electric power is supplied, the plurality of electrodes including at least one electrostatic chuck electrode which is disposed beneath an inner area of the sample mounting surface and another electrostatic chuck electrode which is disposed in an outer peripheral region of the at least one electrostatic chuck electrode beneath the inner area of the sample mounting surface; and
   a controller which is configured to control the supply of the electric power to the plurality of electrodes while the sample is mounted on the sample stage before the process of the sample is initiated, in a manner that a first part of the sample is chucked by supplying the electric power to the at least one electrostatic chuck electrode beneath the inner area of the sample mounting surface, and after the temperature of the sample is changed to a predetermined temperature, a larger part of the sample is chucked by supplying the electric power to the other of the electrodes including the another electrostatic chuck disposed in the outer peripheral region of the at least one electrostatic chuck electrode beneath the inner area of the sample mounting surface.

2. The plasma processing apparatus according to claim 1, wherein the controller is configured to control the supply of the electric power to at least one of the plurality of electrodes in a manner that at least one part of the sample is electrostatically chucked by generating the plasma in the processing chamber.

3. The plasma processing apparatus according to claim 1, wherein the at least one electrostatic chuck electrode disposed beneath an inner area of the sample mounting surface has its radius equal to or greater than 5% of the radius of the sample mounting surface.

4. The plasma processing apparatus according to claim 1, wherein while a part of the sample is being chucked to the top surface of the sample stage, heat transfer gas is fed into gap spaces between at least the part of the sample and the dielectric film.

5. The plasma processing apparatus according to claim 1, wherein the controller is further configured to provide two of the electrodes with different polarities during the process of the sample.

* * * * *